United States Patent
Zhang et al.

(10) Patent No.: US 10,348,243 B2
(45) Date of Patent: Jul. 9, 2019

(54) SWITCHED CAPACITOR CIRCUIT STRUCTURE WITH METHOD OF CONTROLLING SOURCE-DRAIN RESISTANCE ACROSS SAME

(71) Applicant: GLOBALFOUNDRIES INC., Grand Cayman (KY)

(72) Inventors: Chi Zhang, Allen, TX (US); Arul Balasubramaniyan, Plano, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 248 days.

(21) Appl. No.: 15/213,529

(22) Filed: Jul. 19, 2016

(65) Prior Publication Data
US 2018/0026580 A1    Jan. 25, 2018

(51) Int. Cl.
G05F 1/10 (2006.01)
H03B 5/12 (2006.01)
H03J 5/00 (2006.01)

(52) U.S. Cl.
CPC ......... *H03B 5/1265* (2013.01); *H03B 5/1212* (2013.01); *H03B 5/1228* (2013.01); *H03J 5/00* (2013.01); *H03B 2200/004* (2013.01)

(58) Field of Classification Search
CPC ......... G09G 3/3233; G09G 2300/0852; G09G 2300/0861
See application file for complete search history.

(56) References Cited

U.S. PATENT DOCUMENTS

| | | | |
|---|---|---|---|
| 5,706,226 A * | 1/1998 | Chan | H01L 27/1104 257/274 |
| 7,071,790 B2 | 7/2006 | Darabi et al. | |
| 8,193,868 B2 | 6/2012 | Trivedi | |
| 2007/0020837 A1 | 1/2007 | Bryant et al. | |
| 2008/0122519 A1* | 5/2008 | Nowak | G05F 1/562 327/534 |
| 2012/0286888 A1 | 11/2012 | Hsieh et al. | |
| 2013/0020644 A1* | 1/2013 | Horita | H01L 27/1104 257/351 |
| 2014/0320215 A1* | 10/2014 | Staszewski | H03H 11/0405 331/18 |
| 2016/0028410 A1 | 1/2016 | Lim et al. | |

FOREIGN PATENT DOCUMENTS

TW    201342806 A    10/2013

OTHER PUBLICATIONS

TW Search Report issued in connection with corresponding TW Application No. 107-2(8)04502 dated Apr. 30, 2018, pages.
Search Report and written opinion for corresponding Taiwanese Application No. 10820187850 dated Feb. 27, 2019, 16 pages.

* cited by examiner

*Primary Examiner* — Sibin Chen
(74) *Attorney, Agent, or Firm* — David Cain; Hoffman Warnick LLC

(57) ABSTRACT

Embodiments of the present disclosure provide a circuit structure including: a switching transistor including a gate terminal, a back-gate terminal, a source terminal, and a drain terminal; a biasing node coupled to the back-gate terminal of the switching transistor, the biasing node being alternately selectable between an on state and an off state; a first capacitor source-coupled to the switching transistor; a second capacitor drain-coupled to the switching capacitor; and a first enabling node source-coupled to the switching transistor, the first enabling node being alternately selectable between an on state and an off state.

18 Claims, 7 Drawing Sheets

SWITCHED CAPACITOR CIRCUIT STRUCTURE WITH METHOD OF CONTROLLING SOURCE-DRAIN RESISTANCE ACROSS SAME

TECHNICAL FIELD

Embodiments of the disclosure relate generally to integrated circuits, silicon process technology and, more particularly, to circuit structures for a switched capacitor and methods of controlling switch source-drain resistance in a switched capacitor. The various embodiments described herein can be used in a variety of applications, e.g., oscillator circuits.

BACKGROUND

In integrated circuit (IC) structures, a transistor is a critical component for implementing digital circuitry designs. Generally, a transistor includes three electrical terminals: a source, a drain, and a gate. By applying different voltages to the gate terminal, the flow of electric current between the source terminal and the drain terminal of the transistor can be switched on or off. The presence or absence of an applied voltage at the gate terminal of a transistor can be identified as "on" and "off" states of the transistor. Thus, transistors can serve as a switching element in various IC designs, e.g., by manipulating a voltage applied to the gate of each transistor and thereby affecting the flow of electrical current between source and drain terminals of each transistor.

Transistor design and placement can influence the electrical behavior of interconnected elements in an electronic circuit. One conventional arrangement of elements in signal processing applications is the switched capacitor circuit. A switched capacitor circuit can include one or more capacitors electrically connected to the source and/or drain terminals of a transistor, such that the transistor governs the IC structure's ability to charge and discharge the various capacitors in the circuit. Switched capacitors can have a wide variety of applications, particularly in microcircuitry, and an example application may include oscillator circuits, also known as "oscillators." Oscillators generally encompass any circuit which produces an alternating current and/or voltage (AC) output. Conventional oscillators may have multiple transistors therein, e.g., metal-oxide-semiconductor field-effect transistors (MOSFETs) which may be designed to exhibit predetermined operational properties. For example, the "threshold voltage" of the gate for manipulating current flow between source and drain terminals may be predetermined after a MOSFET is manufactured with a particular size. As IC technology continues to decrease in size, the ability to provide high performance oscillators with switched capacitors therein presents a significant technical challenge.

SUMMARY

A first aspect of the present disclosure provides a switched capacitor circuit structure including: a switching transistor including a gate terminal, a back-gate terminal, a source terminal, and a drain terminal; a biasing node coupled to the back-gate terminal of the switching transistor, the biasing node being alternately selectable between an on state and an off state; a first capacitor source-coupled to the switching transistor; a second capacitor drain-coupled to the switching transistor; and a first enabling node gate-coupled to the switching transistor, the first enabling node being alternately selectable between an on state and an off state.

A second aspect of the present disclosure provides a method of controlling source-drain resistance in a switched capacitor circuit, the method including: applying a voltage bias to a biasing node of a circuit structure, the circuit structure including: a switching transistor including a gate terminal, a back-gate terminal coupled to the biasing node, a source terminal, and a drain terminal, a first capacitor source-coupled to the switching transistor, and a second capacitor drain-coupled to the switching transistor; wherein applying the voltage bias lowers a source-drain resistance between the first and second capacitors across the source and drain terminals of the switching transistor; and applying an enabling voltage to the gate terminal of the switching transistor, during the applying of the voltage bias to the back-gate terminal of the switching transistor.

A third aspect of the present disclosure provides a switched capacitor circuit structure including: a switching transistor including a gate terminal, a back-gate terminal, a source terminal, and a drain terminal; a biasing node coupled to the back-gate terminal of the switching transistor, the biasing node being alternately selectable between an on state and an off state; a first capacitor source-coupled to the switching transistor at a first node; a second capacitor drain-coupled to the switching transistor at a second node; a first node transistor source-coupled to the first node, such that a source terminal of the first node transistor is directly connected to the first capacitor and the source terminal of the switching transistor; a second node transistor source-coupled to the second node, such that a source terminal of the second node transistor is directly connected to the second capacitor and the drain terminal of the switching transistor; and a first enabling node gate-coupled to the switching transistor, the first node transistor and the second node transistor, the first enabling node being alternately selectable between an on state and an off state.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
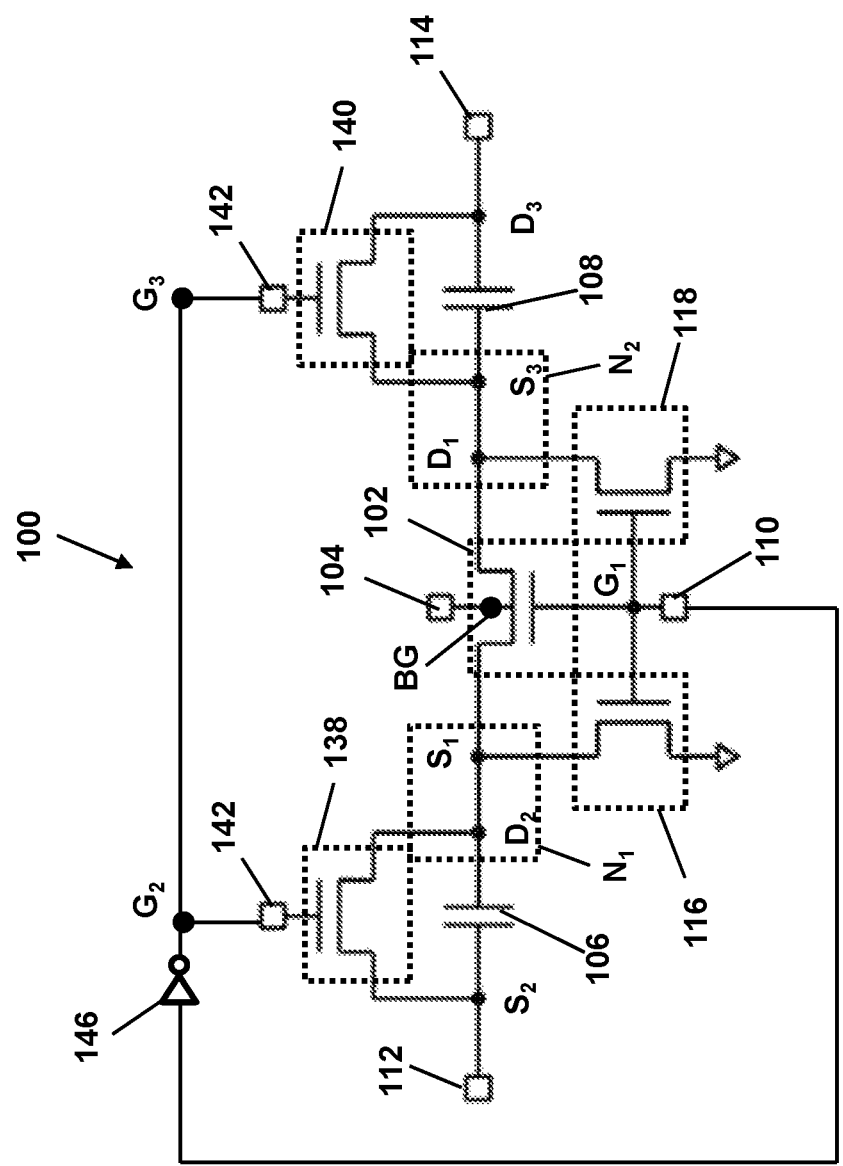
FIG. 1 shows a schematic diagram of an integrated circuit (IC) structure according to embodiments of the present disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure include switched capacitor circuit structures and methods of controlling at least the source-drain resistance of a switching transistor in a switched capacitor circuit structure. The structure can include a switching transistor directly electrically coupled to first and second capacitors through its source and drain terminals. A gate terminal of the switching transistor can be coupled to a first enabling node, such that applying at least a threshold voltage to the first enabling node electrically connects the first capacitor to the second capacitor, through the source and drain terminals of the switching transistor. The switching transistor can also be coupled to a biasing node through a back-gate terminal thereof. For instance, a switching transistor in the form of a semiconductor on insulator (SOI) transistor, e.g., a fully-depleted (FDSOI) transistor can provide an additional terminal for controlling the voltage of a region proximal to the channel region of the transistor, as described elsewhere herein. Applying a voltage to the biasing node can lower the threshold voltage of the switching transistor, relative to transistors in conventional oscillator circuits, by providing an additional voltage to the channel region through the back-gate of the switching transistor. The biasing node can also affect other physical and electrical properties of the switching transistor, such that the switching transistor may be used in a variety of device configurations and contexts.

As compared to conventional switched capacitors, embodiments of the present disclosure described herein can offer several technical and commercial advantages. For instance, the use of a switching transistor with a back-gate terminal coupled to a biasing node can allow a user, manufacturer, etc., to adjust the threshold voltage of the switching transistor during manufacture and/or after deployment. Conventional switching transistors may not offer this ability because conventionally formed transistors may include a channel region positioned within, e.g., a p-doped well of a conventional substrate. Any voltage bias applied to such a structure will be constrained by leakage current associated with biasing the gate of a transistor formed therein. Including a back-gate biased switching transistor can also lower a parasitic source-drain resistance of the switching transistor relative to conventional transistors without terminals for applying a back-gate bias voltage. The back-gate bias voltage of switching transistors according to the present disclosure can also be varied after deployment, e.g., to account for manufacturing and temperature variations of a device. These varying features of a back-gate biased switching transistor in a switched capacitor circuit can also avoid the use of additional circuit elements designed to compensate for the same design concerns by conventional techniques.

Referring to FIG. 1, a switched capacitor circuit structure ("circuit structure" or "structure" hereafter) 100 is shown according to embodiments of the present disclosure. Structure 100 can include a switching transistor 102 including a gate terminal $G_1$, a back-gate terminal BG, in addition to source and drain terminals $S_1$, $D_1$. A biasing node 104 can be directly electrically connected (i.e., electrically coupled without intervening circuit elements there between) to back-gate terminal BG of switching transistor 102. Biasing node 104 can be alternately selectable between on and off states, e.g., by being alternatively connected to predetermined "high" and "low" voltages. As examples a voltage of approximately five-hundred millivolts (mV) to approximately six volts can define a high voltage, while a voltage of approximately zero mV to approximately negative six volts can define a low voltage. It is understood that any conceivable voltage or range of voltages may define respective high and low voltage levels for implementing circuit functions, logic, etc. A first capacitor 106 can be source-coupled to switching transistor 102, while a second capacitor 108 can be drain-coupled to switching transistor 102. A first enabling node 110 can be directly electrically coupled to gate terminal $G_1$ of switching transistor 102, and can also be alternately selectable between on and off states, e.g., by including or being coupled to an adjustable voltage source (not shown) which may be switched between high and low voltage levels. Each capacitor 106, 108 can be an operative capacitor element of an oscillator circuit, e.g., a voltage-controlled oscillator circuit or a digitally-controlled oscillator circuit. More generally, structure 100 may embody or form part of any circuit which produces an alternating current (AC) output which can be controlled by manipulating voltages and/or signals provided to the electronic elements therein.

A first oscillation node 112 can be coupled to one terminal of first capacitor 106, while the other terminal of first capacitor 106 can be source-coupled to switching transistor 102 as discussed elsewhere herein. In addition, second capacitor 108 can be drain-coupled to switching transistor 102 at one terminal and coupled to a second node 114 at its other terminal. First and second oscillation nodes 112, 114 can thereby define two inputs or outputs (e.g., polarization and modulation input nodes, output nodes of a oscillator, as frequently termed in the art) to structure 100, such that first enabling node 110 being in an on state creates a series electrical connection from first oscillation node 112 through first capacitor 106, switching transistor 102, and second capacitor 108, to second oscillation node 114 or vice versa. To provide an electrical connection from each oscillation node 112, 114 to other circuit elements coupled to structure 100, first enabling node 110 can also be gate coupled to first and second node transistors 116, 118. This arrangement can cause first enabling node 110 to permit very small current flow through first and second node transistors 116, 118 in response to a high or on voltage level being applied thereto, thereby setting nodes N1 and N2 to ground potential. The source or drain terminal of first and second node transistors 116, 118 can be directly electrically connected to first and second nodes $N_1$, $N_2$ of structure 100 where first capacitor 106 connects to switching transistor 102 ($N_1$) and second capacitor 108 connects to switching transistor 102 ($N_2$). The arrows in FIG. 1 extending from the drain terminals of first and second node transistors 116, 118 generally represent a connection to other circuit elements and/or independent circuit structures.

Figure 2:
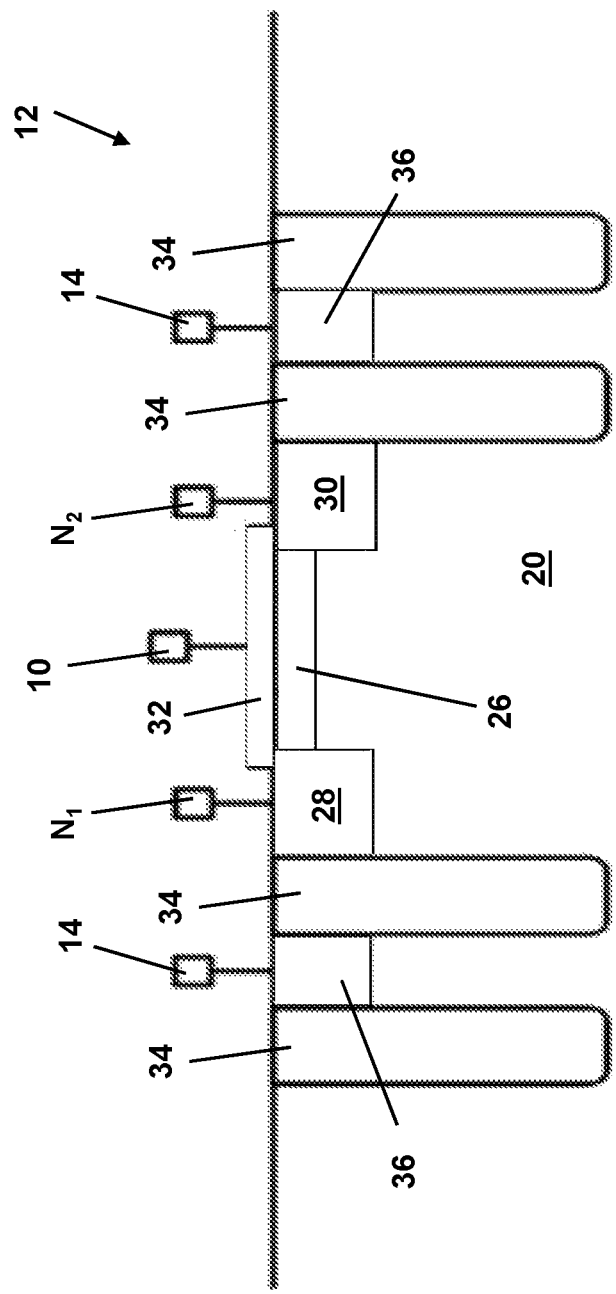
FIG. 2 shows a cross-sectional view of a conventional transistor structure fabricated by application of conventional bulk processing technology.

Referring to FIG. 2, a conventional transistor 12 is depicted as an example to further emphasize the features of switching transistors 102 according to embodiments of the present disclosure. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials as described elsewhere herein. First and second nodes N1, N2 of conventional transistor 12 may be coupled to regions of substrate 20 which include conductive dopants therein, e.g., a source region 28 and a drain region 30 separated by a channel region 26. A gate region 32 formed on channel region 26 can be coupled to an enabling node 10 to control the formation of a conductive channel within channel region 26. A group of trench isolations 34 may be formed from electrically insulating materials such that regions 26, 28, 30 are laterally separated from each other. In conventional transistor 12, oscillation nodes 14 may be coupled to terminals 36 laterally external to regions 26, 28, 30. As shown, trench isolations 36 form an insulating barrier between terminals 36 and regions 26, 28, 30 and/or other elements. Further features of each element in conventional transistor 12 (e.g., function and material composition) are described in detail elsewhere herein relative to similar components in switching transistor 102.

Figure 3:
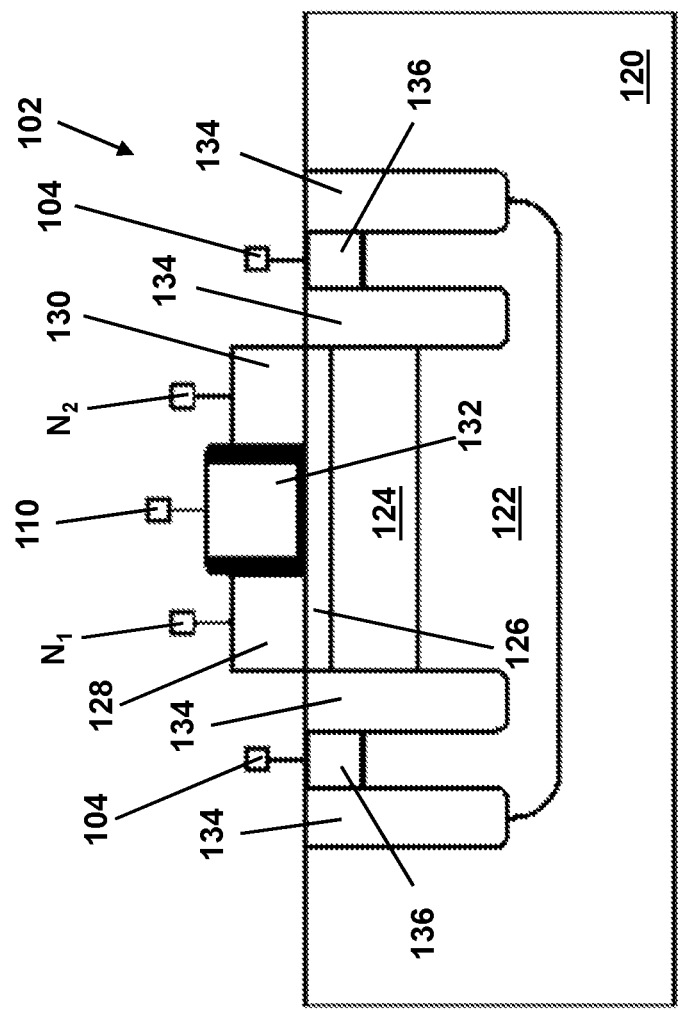
FIG. 3 shows a cross-sectional view of a switching transistor in an IC structure according to embodiments of the present disclosure.

Turning to FIG. 3, a cross-sectional view of switching transistor 102 is shown to illustrate operational features of structure 100 (FIG. 1) in embodiments of the present disclosure. Switching transistor 102 can be formed with structural features for reducing the electrical resistance across source and drain terminals $S_1$, $D_1$ thereof. In turn, these attributes of switching transistor 102 can increase quality factor (commonly denoted by "Q") of associated capacitor differential (i.e., differences in capacitance for first and second capacitors 106, 108) in structure 100. Such increases in quality factor may provide performance advantages in circuits, e.g., oscillators, including without limitation: better noise, lower power consumption, smaller silicon area, etc. Switching transistor 102 can be formed within a substrate 120. Substrate 120 can include can be composed of any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In an example embodiment, the entirety of substrate 120 or a portion thereof may be strained.

An n-type doped well ("N-well") region 122 of substrate 120 can be implanted with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation refers to a process in which ions are accelerated toward a solid surface to penetrate the solid up to a predetermined range based on the energy of the implanted ions. Thus, N-well region 122 can include the same material composition as the remainder of substrate 120, but can additionally include dopant materials therein. A buried insulator layer 124, also known in the art as a "buried oxide" or "BOX" layer, can separate N-well region 122 of substrate 120 from a channel region 126 of switching transistor 102. Switching transistor 102 thereby provides a "fully-depleted semiconductor on insulator" (FDSOI) structure, distinguishable from other structures (e.g., conventional transistor 12 (FIG. 2) by including buried insulator layer 124, back-gate contacts 104, etc., thereby allowing technical advantages such as an adjustable threshold voltage for switching transistor 102 as discussed elsewhere herein.

Channel region 126 may electrically couple a source terminal 128 of switching transistor 102 to a drain terminal 130 of switching transistor 102. A gate stack 132 can be positioned over channel region 126, such that a voltage of first enabling node 110 controls the electrical conductivity between source and drain terminals 128, 130 through channel region 126. Gate stack 132 can have, e.g., one or more electrically conductive metals therein, in addition to a gate dielectric material (indicated with black shading) for separating the conductive metal(s) of gate stack 132 from at least channel region 124. A group of trench isolations 134, in addition, can electrically and physically separate the various regions of switching transistor 102 from each other. Trench isolations 134 may be composed of any insulating material such as $SiO_2$ or a "high-k" dielectric having a high dielectric constant, which may be, for example, above 3.9. In some situations, trench isolations 134 may be composed of an oxide substance. Materials appropriate for the composition of trench isolations 134 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

To further influence the conductivity between terminals 128, 130 through channel region 126, N-well region 122 can be electrically coupled to biasing node 104 through back-gate terminals 136 within substrate 120. Applying an electrical potential to back-gate terminals 136 can induce an electric charge within N-well region 122, thereby creating a difference in electrical potential between N-well region 122 and channel region 126 across buried insulator layer 124. Among other effects, this difference in electrical potential between N-well region 122 and channel region 126 of substrate 120 can lower the threshold voltage of switching transistor 102, i.e., the minimum voltage for inducing electrical conductivity across channel region 126 between source and drain terminals 128, 130 as discussed herein. In particular, applying a back-gate biasing voltage to back-gate terminals 136 can lower the threshold voltage of switching transistor 102, thereby reducing source drain resistance, relative to the threshold voltage of switching transistor 102 when no voltage is applied to back-gate terminals 136. This ability of switching transistor 102, among other things, can allow a reduced width (saving silicon area) relative to conventional applications and transistor structures. In an example embodiment, a width of channel region 126 (i.e., into and out of the plane of the page) can be between approximately 0.3 micrometers (μm) and approximately 2.4 μm. A length of channel region 126 (i.e., left to right within the plane of the page) between source and drain terminals 128, 130 can be, e.g., approximately twenty nanometers (nm).

Returning to FIG. 1, implementing circuit structure 100 in which switching transistor 102 includes back-gate terminals 136 (e.g., pursuant to the structure such as that shown in FIG. 3) can allow a user to vary the electrical characteristics of structure 100 during operation. Structure 100 can operate with a decreased/increased (variable) range of threshold voltages and/or sizes for channel region 126 (FIG. 3) relative to circuit structures with conventional transistors therein, e.g., NMOS transistors without back-gate terminals 136. Embodiments of structure 100 can also include additional structures for controlling the behavior of first and second capacitors 106, 108. In particular, structure 100 can include first and second bypass transistors 138, 140 source-coupled and drain-coupled to opposing terminals of each capacitor 106. The source and drain connections to first bypass transistor 138 are denoted by nodes $S_2$ and $D_2$, while the source and drain connections to second bypass transistor 140 are denoted by nodes $S_3$ and $D_3$.

Each bypass transistor 138, 140 can be gate-coupled to a second enabling node 142 at respective points of electrical contact (shown with nodes $G_2$, $G_3$ in FIG. 1). Bypass transistors 138, 140 can thus selectively permit a flow of current from first and second nodes 112, 114 to bypass first and second capacitors 106, 108, e.g., when bypass transistors 138, 140 are in an "on" state. Bypass transistors 138, 140 being in an "off" state can cause current to flow through capacitors 106, 108 as described elsewhere herein. To provide a switched capacitor functionality, second enabling node 142 can be coupled to first enabling node 110 through an inverter 146 electrically interposed therebetween. An inverter generally refers to a conventional two-terminal circuit element for switching the voltage between "high" and "low" or vice versa between two interconnected elements. Inverter 146 can cause first enabling node 110 and second enabling node 142 to have opposite values, such that first enabling node 110 being at a high voltage can cause second enabling node 142 to be at a low voltage, and vice versa. The coupling of first and second enabling nodes 110, 142 through inverter 146 can thereby cause bypass transistors 138, 140 to be in an on state when transistors 102, 116, 118 are in an off state, and vice versa. Embodiments of IC structure 100 thus provide a switched capacitor circuit which can switch, vary, etc., the capacitors serving as "IN" and "OUT" capacitors in an oscillation circuit and thus provide tunability for many IC circuits, e.g., oscillators.

Figure 4:
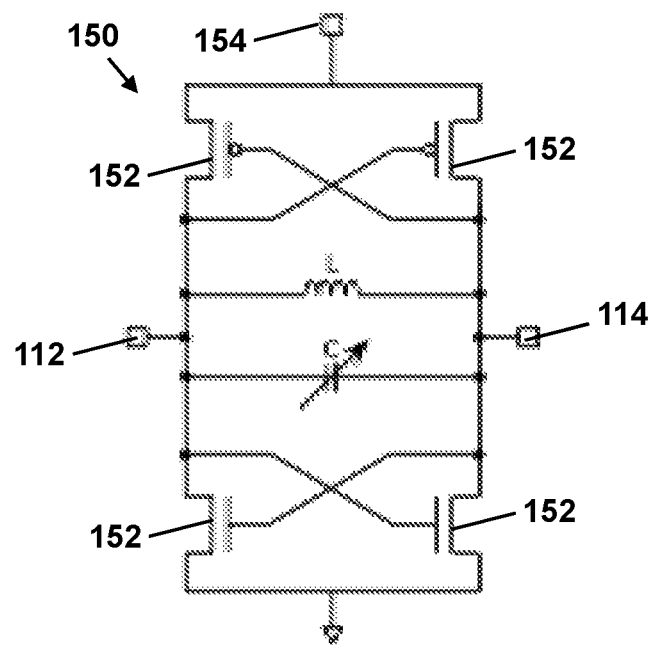
FIGS. 4 and 5 provide schematic depictions of IC structures according to the present disclosure in an oscillator circuit according to an example application.
Figure 5:
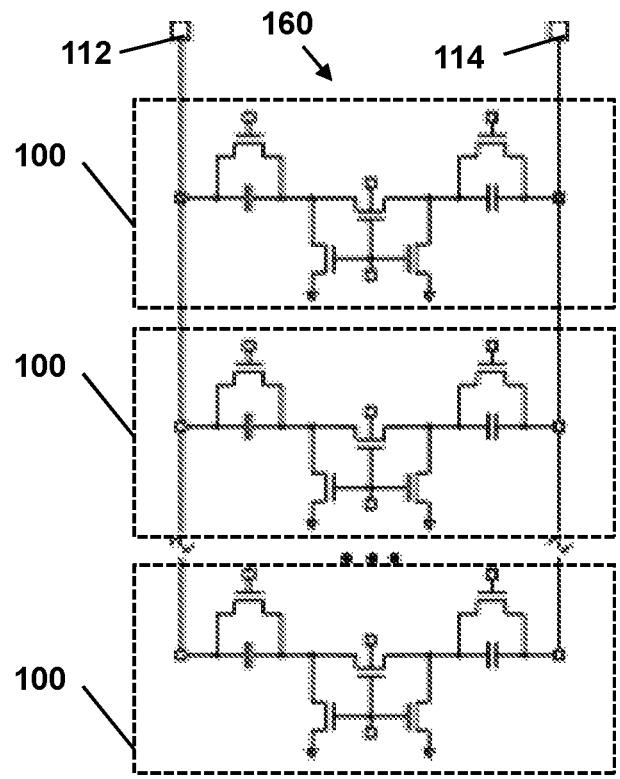

Referring to FIGS. 4 and 5 together, an example application of IC structure 100 as part of an oscillator circuit scheme is shown according to applications of the present disclosure. As shown in FIG. 4, an oscillator circuit 150 (e.g., a voltage-controlled or digitally-controlled oscillator) may include a plurality of transistors 152 coupled at their gates to first or second nodes 112, 114 while being coupled at their source and drain terminals to the other node 112, 114, with oscillator circuit 150 including a power supply 154 connected to each transistor 152. An equivalent capacitor element C and an inductor element L are connected in parallel to transistors 152 between each node 112, 114 in the schematic view of oscillator circuit 150. In the schematic view of FIG. 5, each group of transistors 152 can be substituted for a transistor array 160 including multiple embodiments of IC structure 100 coupled to first and second nodes 112, 114, thereby providing tunability of oscillator circuit 150 through switching transistors 102 therein. Transistor array 160 can be varied to include any desired number of switching transistors 102 therein to account for various design preferences and/or requirements. More specifically, switching transistors 102 (which may include, e.g., fully depleted SOI transistors as described herein) can provide back-gate control over the threshold voltage and source-drain resistance of switching transistor 102, thereby increasing the quality factor of oscillator circuit 150. Such improvements in the quality factor of oscillator circuit 150 can yield benefits such as reduced power consumption, improved circuit tenability, and reductions in noise during operation.

Figure 6:
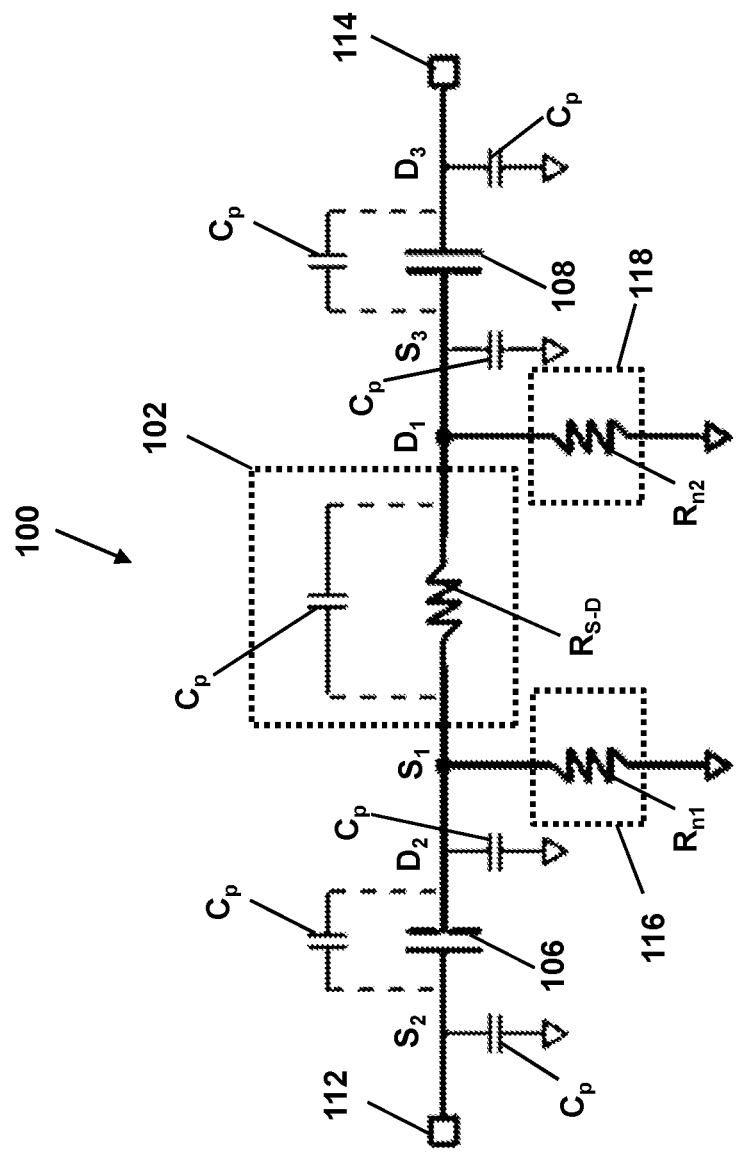
FIG. 6 shows a schematic view of an equivalent circuit diagram for an IC structure according to the present disclosure, with a switching transistor in an on state.

Referring to FIGS. 1 and 6 together, FIG. 6 provides a schematic depiction of an equivalent circuit diagram for structure 100 when switching transistor 102 and node transistors 116, 118 in an on state while bypass transistors 138, 140 are in an off state. As shown in FIG. 6, switching transistor 102 can provide an electrical connection between source and drain nodes $S_1$, $D_1$, each coupled between first and second oscillation nodes 112, 114 and remaining portions of a circuit. In an on state, the electrical connection between source and drain nodes $S_1$, $D_1$ can have an associated source-drain resistance $R_{S-D}$ to account for losses in voltage between nodes $S_1$, $D_1$. Switching transistor 102 in an on state can further be modeled to account for a parasitic capacitance $C_p$ in parallel with source-drain resistance $R_{S-D}$. The parasitic capacitance $C_p$ of switching transistor 102 is significantly lower in FDSOI technology compared to conventional transistor 12, and Cp may also be larger in conventional transistor 12 due to depletion capacitance of to any doped well components therein. Such limitations are avoided in embodiments of switching transistor 102. As shown in FIG. 1 and described elsewhere herein, applying a back-gate voltage bias to switching transistor 102, lowers threshold voltage and therefore lowers source-drain resistance $R_{S-D}$. This can be expressed in terms of mathematical models for current and resistance within a transistor, e.g., source drain resistance ($R_{S-D}$) being inversely proportional to voltage overdrive ($V_{g-s}-V_t$ (gate-source voltage minus threshold voltage)). Enabling the back gate voltage to switching transistor 102 voltage, in terms of a voltage model, increases voltage overdrive and therefore decreases $R_{S-D}$. In conventional applications, $R_{S-D}$ would otherwise by decreased by increasing the width of conventional transistor 12 to use a larger area of semiconductor material.

In addition to these properties of switching transistor 102, first and second node transistors in the on state may also exhibit source-drain resistances ($R_{n1}$, $R_{n2}$, respectively) between source and drain nodes $S_1$, $S_2$ and remaining circuit elements. Bypass transistors 138, 140 being in an off state can cause electrical current from oscillation nodes 112, 114 to pass through first and second capacitors 106, 108. Each bypass transistor 138, 140 may have an associated inherent parasitic capacitance $C_p$ representing leakage current to various structures within bypass transistor 138, 140 and/or other components, which may stem, e.g., from physical constraints and/or manufacturing variance. The remaining nodes of structure 100 can also include inherent parasitic capacitances $C_p$ stemming from, e.g., manufacture and/or design constraints. In any event, applying a back-gate voltage bias to switching transistor 102 can lower source-drain resistance $R_{S-D}$ relative to conventional structures, and/or can provide approximately the same value of source-drain resistance $R_{S-D}$ but with a reduced channel region width relative to conventional structures, as discussed elsewhere herein.

Figure 7:
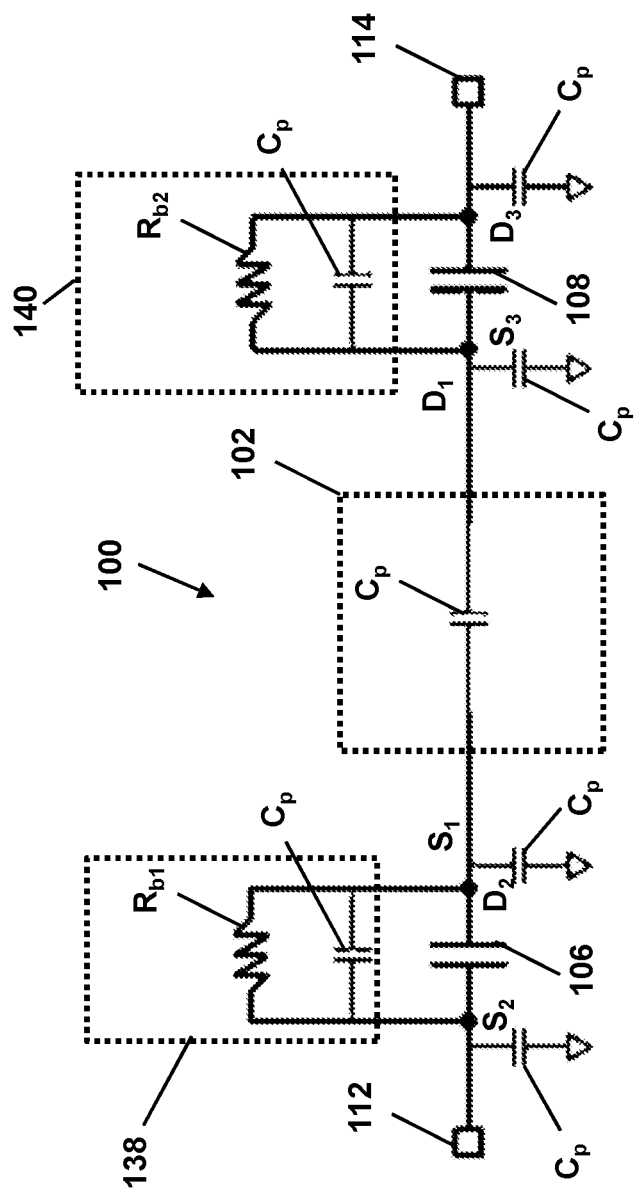
FIG. 7 shows a schematic view of an equivalent circuit diagram for an IC structure according to the present disclosure, with a switching transistor in an off state.

Turning to FIGS. 1 and 7 together, FIG. 7 provides a schematic depiction of an equivalent circuit diagram for structure 100 when switching transistor 102 and node transistors 116, 118 (FIG. 1 only) in an off state while bypass transistors 138, 140 are in an on state. As noted elsewhere herein, structure 100 can be modeled to include parasitic capacitances $C_p$ at each terminal of first and second transistors 106, 108 to account for any voltage losses in structure 100. In addition, switching transistor 102 in the off state may continue to exhibit a parasitic capacitance $C_p$ between its source and drain terminals $S_1$, $D_1$. However, switching transistor 102 being in an off state can eliminate the electrical connection between each terminal $S_1$, $D_1$ of switching transistor 102, such that only a parasitic capacitance $C_p$ causes connects the source and drain terminals of switching transistor 102 to each other. This parasitic capacitance Cp is substantially lower for embodiments of switching transistor 102 as compared to conventional transistor(s) 12.

Bypass transistors 138, 140 can have respective source-drain resistances $R_{b1}$, $R_{b2}$ and parasitic capacitances $C_p$ in parallel with first and second capacitors 106, 108. Relative to the electrical impedance of first and second capacitors 106, 108 stemming from the capacitance of these elements, bypass transistors 138, 140 may have greatly reduced electrical resistance ($R_{b1}$, $R_{b2}$) and/or impedance ($C_p$), allowing current from oscillation nodes 112, 114 to bypass first and second capacitors 106, 108 when bypass transistors 138, 140 are turned on. Bypass transistors 138, 140 can thereby allow structure 100 to provide a switched capacitor capability during operation between on and off states of switching transistors 102, e.g., by invertedly coupling bypass transistors 138, 140 to first enabling node 110. When switching transistor 102 is turned off, the coupling between first and second enabling nodes 110, 142 can allow capacitors 106, 108 to substantially be disregarded. This further reduction in electrical resistance relative to switching transistor 102 being turned on can permit further reduction in the size of channel region 126 (FIG. 3) of switching transistor 102.

Figure 8:
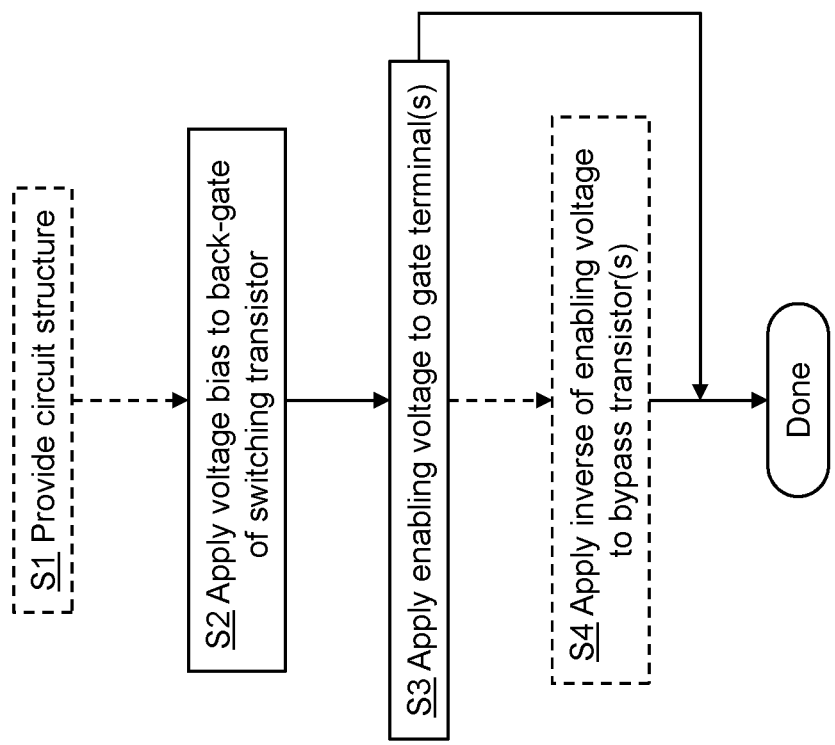
FIG. 8 shows an illustrative flow diagram of a method of controlling source-drain resistance in a switched capacitor circuit according to embodiments of the present disclosure.

Referring to FIGS. 1 and 8 together, methods according to the present disclosure can thus include methods of controlling source-drain resistance in switching transistor 102 of a switched capacitor circuit, e.g., structure 100, relative to forming or operating structure 100 by conventional techniques. In an example embodiment, methods of the present disclosure can include providing an embodiment of structure 100, as discussed elsewhere herein (e.g., by fabrication, purchase, modification, and/or other processes of providing embodiments of structure 100) at step S1. Step S1 is shown in FIG. 8 using a phantom outline to indicate that this step may be preliminary and/or implemented independently from other processes described herein. At step S2, methods according to the present disclosure can include applying a back-gate voltage bias to switching transistor 102 (e.g., through biasing node 104) such that a source-drain resistance across switching transistor 102 is reduced. In addition, a voltage can also be applied to first enabling node 110 at step S3 to put switching transistor 102 (and, optionally, first and second node transistors 116, 118) in an on state. The applying of voltage bias in step S3 can be concurrent with applying a voltage bias to the back-gate of switching transistor 102 from biasing node 104 in step S2, e.g., to maintain the reduced source-drain resistance across switching transistor 102.

In some cases, methods according to the present disclosure can include applying an inverse of the enabling voltage at first enabling node 110 to gate terminals of bypass transistors 138, 140, i.e., at second enabling node 142 in step S4. Step S4 may be omitted in some embodiments, and thus is illustrated using a phantom line. Applying the opposite voltage to second enabling node 142 in step S4 can cause first and second bypass transistors 138, 140 to be turned off when switching transistor 102 is turned on, or turned on when switching transistor 102 is turned off. This functionality can stem from, e.g., each bypass transistor 138, 140 being gate-coupled at second enabling node 142 to first enabling node 110 through inverter 146. The method can then conclude ("Done") and/or be executed again by returning to step(s) S1 and/or S2 in a looping fashion. Methods according to the present disclosure can be implemented as a companion process and/or integral process for operating an oscillator circuit including switched capacitors (e.g., first and second capacitors 106, 108 therein) to yield one or more advantages such as a reduced total size of switching transistor 102 and/or other elements included within structure 100, relative to conventional switched capacitor circuits.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A switched capacitor circuit structure comprising:
a switching transistor including a gate terminal, a source terminal, and a drain terminal, wherein the switching transistor further includes:
a fully depleted semiconductor on insulator (FDSOI) channel region positioned laterally between the source terminal and the drain terminal,
a buried insulator layer positioned directly beneath the FDSOI channel region, and
a back gate terminal including n type semiconductor separated from the channel region of the switching transistor by the buried insulator layer;
a biasing node coupled to the back-gate terminal of the switching transistor, the biasing node being alternately selectable between an on state and an off state;
a first capacitor coupled to the source of the switching transistor;
a second capacitor coupled to the drain of the switching transistor; and
a first enabling node coupled to the gate of the switching transistor, the first enabling node being alternately selectable between an on state and an off state.

2. The circuit structure of claim 1, wherein the biasing node being in the on state lowers a threshold voltage of the gate terminal of the switching transistor.

3. The circuit structure of claim 1, wherein the biasing node being in the on state lowers a source-drain resistance of the switching transistor, relative to the biasing node being in the off state.

4. The circuit structure of claim 1, wherein the first and second capacitors comprise portions of a voltage-controlled oscillator circuit or portions of a digitally-controlled oscillator circuit.

5. The circuit structure of claim 1, further comprising:
a first bypass transistor with a source and drain coupled to opposing terminals of the first capacitor; and
a second bypass transistor with a source and drain coupled to opposing terminals of the second capacitor, wherein the first bypass transistor includes a gate coupled to a second enabling node, and
wherein the second bypass transistor includes a gate coupled to the second enabling node.

6. The circuit structure of claim 5, wherein the first enabling node is coupled to the second enabling node through an inverter, such that the first enabling node being in the off state causes the second enabling node to be in an on state, or the first enabling node being in the on state causes the second enabling node to be in an off state.

7. The circuit structure of claim 1, further comprising:
a first node positioned directly between the first capacitor and the source terminal of the switching transistor, the first node being coupled to the drain of a first node transistor; and
a second node positioned directly between the second capacitor and the drain terminal of the switching transistor, the second node being coupled to the drain of a second node transistor,
wherein the gate of the first node transistor and the gate of the second node transistor are coupled to the first enabling node.

8. A method of controlling source-drain resistance in a switched capacitor circuit, the method comprising:
applying a voltage bias to a biasing node of a circuit structure, the circuit structure including:
a switching transistor, including a gate terminal, a source terminal, and a drain terminal, wherein the switching transistor further includes:
a fully depleted semiconductor on insulator (FDSOI) channel region positioned laterally between the source terminal and the drain terminal,
a buried insulator layer positioned directly beneath the FDSOI channel region, and
a back gate terminal, coupled to the biasing node, including n type semiconductor separated from the channel region of the switching transistor by the buried insulator layer,
a first capacitor coupled to the source of the switching transistor, and
a second capacitor coupled to the drain of the switching transistor;
wherein applying the voltage bias lowers a source-drain resistance between the first and second capacitors across the source and drain terminals of the switching transistor; and
applying an enabling voltage to the gate terminal of the switching transistor, during the applying of the voltage bias to the back-gate terminal of the switching transistor.

9. The method of claim 8, wherein applying the voltage bias to the back-gate terminal of the switching transistor further lowers a threshold voltage of the gate terminal of the switching transistor relative to the voltage bias not being applied to the back-gate terminal.

10. The method of claim 8, wherein the circuit structure further includes:
a first bypass transistor including a first gate, the first bypass transistor's source and drain being coupled to opposing terminals of the first capacitor, and
a second bypass transistor including a second gate, the source and drain of the second bypass transistor being coupled to opposing terminals of the second capacitor,
wherein applying the enabling voltage to the gate terminal of the switching transistor further includes applying an inverse of the enabling voltage to the first and second gates of the first and second bypass transistors.

11. The method of claim 10, wherein the gate terminal of the switching transistor is cross-coupled to the first and second gates of the first and second bypass transistors through an inverter.

12. The method of claim 8, wherein the first and second capacitors comprise portions of a voltage-controlled oscillator circuit or portions of a digitally-controlled oscillator circuit.

13. The method of claim 8, wherein the circuit structure further includes:
a first node positioned directly between the first capacitor and the source terminal of the switching transistor, the first node being coupled to the drain of a first node transistor; and
a second node positioned directly between the second capacitor and the drain terminal of the switching transistor, the second node being coupled to the drain terminal of a second node transistor,
wherein the gates of the first node transistor and the second node transistor are coupled to the first enabling node, such that applying the enabling voltage to the gate terminal of the switching transistor switches each of the first node transistor and the second node transistor into an on state.

14. A switched capacitor circuit structure comprising:
a switching transistor including a gate terminal, a source terminal, and a drain terminal, wherein the switching transistor further includes:
a fully depleted semiconductor on insulator (FDSOI) channel region positioned laterally between the source terminal and the drain terminal,
a buried insulator layer positioned directly beneath the FDSOI channel region, and
a back gate terminal including n type semiconductor separated from the channel region of the switching transistor by the buried insulator layer;
a biasing node coupled to the back-gate terminal of the switching transistor, the biasing node being alternately selectable between an on state and an off state;
a first capacitor coupled to the source of the switching transistor at a first node;
a second capacitor coupled to the drain of the switching transistor at a second node;
a first node transistor with the drain thereof coupled to the first node, such that a drain terminal of the first node transistor is directly connected to the first capacitor and the source terminal of the switching transistor;
a second node transistor with the drain thereof coupled to the second node, such that a drain terminal of the second node transistor is directly connected to the second capacitor and the drain terminal of the switching transistor; and
a first enabling node coupled to the gate of the switching transistor, the first node transistor and the second node transistor, the first enabling node being alternately selectable between an on state and an off state.

15. The circuit structure of claim 14, further comprising:
a first bypass transistor with a source and a drain thereof coupled to opposing terminals of the first capacitor; and
a second bypass transistor with a source and a drain thereof coupled to opposing terminals of the second capacitor,
wherein the gates of the first and second bypass transistors are coupled to a second enabling node.

16. The circuit structure of claim 15, wherein the first enabling node is coupled to the second enabling node through an inverter, such that the first enabling node being in the off state causes the second enabling node to be in an on state, or the first enabling node being in the on state causes the second enabling node to be in an off state.

17. The circuit structure of claim 14, wherein the first and second capacitors comprise portions of a voltage-controlled oscillator circuit or portions of a digitally-controlled oscillator circuit.

18. The circuit structure from claim 17, wherein the biasing node being in the on-state increases a quality factor of the voltage-controlled oscillator circuit or the digitally-controlled oscillator circuit above an initial quality factor with the biasing node in the off-state.

* * * * *